(12) United States Patent
Dall'Aglio

(10) Patent No.: US 8,546,760 B2
(45) Date of Patent: Oct. 1, 2013

(54) APPARATUS AND METHOD FOR CHECKING THICKNESS DIMENSIONS OF AN ELEMENT WHILE IT IS BEING MACHINED

(75) Inventor: Carlo Dall'Aglio, Castello d'Argile Bo (IT)

(73) Assignee: Marposs Societa'per Azioni, Bentivoglio (BO) (IT)

( * ) Notice: Subject to any disclaimer, the term of this patent is extended or adjusted under 35 U.S.C. 154(b) by 614 days.

(21) Appl. No.: 12/668,720

(22) PCT Filed: Jul. 18, 2008

(86) PCT No.: PCT/EP2008/059438
§ 371 (c)(1),
(2), (4) Date: Jan. 12, 2010

(87) PCT Pub. No.: WO2009/013231
PCT Pub. Date: Jan. 29, 2009

(65) Prior Publication Data
US 2010/0182592 A1  Jul. 22, 2010

(30) Foreign Application Priority Data

Jul. 20, 2007  (IT) .............................. BO2007A0504

(51) Int. Cl.
*G01N 21/35*  (2006.01)
*G01B 11/06*  (2006.01)
(52) U.S. Cl.
USPC ........................... 250/339.06; 356/630; 438/7
(58) Field of Classification Search
USPC ............ 250/339.06, 339.11; 356/630; 438/7
See application file for complete search history.

(56) References Cited

U.S. PATENT DOCUMENTS

| | | | |
|---|---|---|---|
| 5,609,511 A | 3/1997 | Moriyama et al. | |
| 5,657,123 A | 8/1997 | Mogi et al. | |
| 5,999,264 A | 12/1999 | Handa | |
| 6,095,899 A * | 8/2000 | Elmar et al. | 451/28 |
| 6,368,881 B1 | 4/2002 | Brouillette et al. | |
| 6,395,130 B1 | 5/2002 | Adams et al. | |
| 6,437,868 B1 | 8/2002 | Coult et al. | |
| 6,551,172 B1 | 4/2003 | Nyui et al. | |
| 6,602,724 B2 * | 8/2003 | Redeker et al. | 438/5 |

(Continued)

FOREIGN PATENT DOCUMENTS

| | | |
|---|---|---|
| DE | 10 2004 034 693 A1 | 2/2006 |
| EP | 1 108 979 A2 | 6/2001 |

(Continued)

*Primary Examiner* — David Porta
*Assistant Examiner* — Casey Bryant
(74) *Attorney, Agent, or Firm* — Dickstein Shapiro LLP

(57) ABSTRACT

An apparatus for checking thickness dimensions in a semiconductor wafer (1) during grinding operations includes an optical probe (3) which transmits infrared radiations on the surface (2) being machined of the wafer (1), and detects beams that are reflected by said surface, by an opposite surface (2') of the wafer and/or by surfaces (2", 2''') separating different layers in the wafer. The beam of emitted and reflected radiations travels along a path (4) with known and constant discontinuities, in part through the air (15) and in part through a cushion (30) of low flow liquid, which flows with substantially laminar flow. A support and positioning element (7) for the optical probe includes hydraulic ducts (22,25) that generate the liquid cushion. A method for checking the thickness dimensions includes the generation of the liquid cushion at the path along which the beam of emitted and reflected radiations travels.

13 Claims, 1 Drawing Sheet

(56) References Cited

U.S. PATENT DOCUMENTS

| | | |
|---|---|---|
| 6,628,397 B1 | 9/2003 | Nikoonahad et al. |
| 6,671,051 B1 | 12/2003 | Nikoonahad et al. |
| 7,072,050 B2 | 7/2006 | Kimba et al. |
| 7,175,503 B2 | 2/2007 | Lehman et al. |
| 2004/0067718 A1 | 4/2004 | Shimizu et al. |
| 2005/0195412 A1 | 9/2005 | Opsal |
| 2005/0254051 A1 | 11/2005 | Shima et al. |
| 2006/0012804 A1 | 1/2006 | Wilke et al. |
| 2010/0182592 A1* | 7/2010 | Dall'Aglio .................. 356/51 |

FOREIGN PATENT DOCUMENTS

| | | |
|---|---|---|
| JP | H07-004921 A | 1/1995 |
| JP | 8-216016 A | 8/1996 |
| JP | H09-260317 A | 10/1997 |
| JP | 2002-198341 | 7/2002 |
| JP | 2002-221406 | 8/2002 |
| JP | 2003-531735 | 10/2003 |
| JP | 2004-119850 A | 4/2004 |
| JP | 2005-327938 A | 11/2005 |
| WO | WO 01/63201 A2 | 8/2001 |

\* cited by examiner

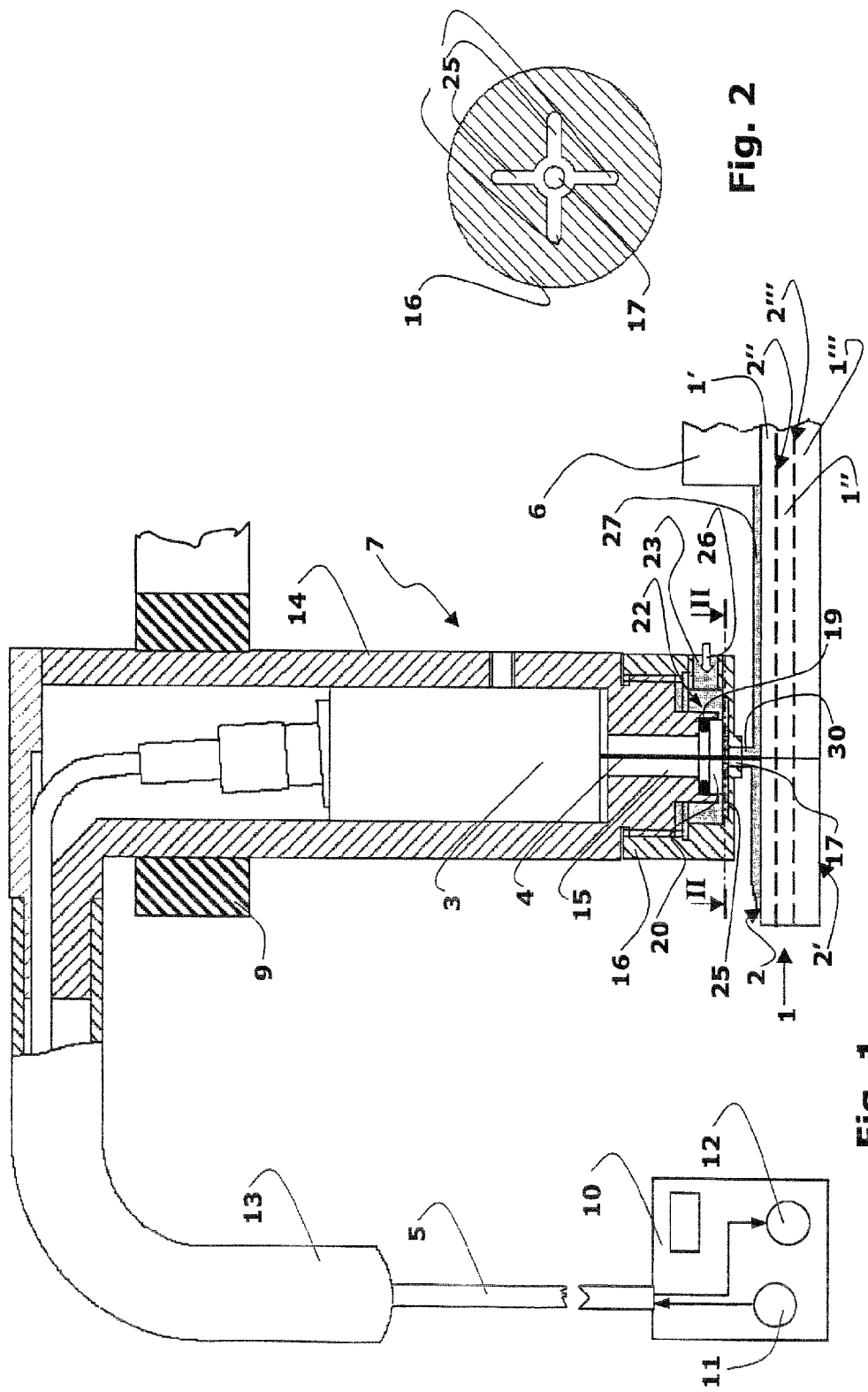

APPARATUS AND METHOD FOR CHECKING THICKNESS DIMENSIONS OF AN ELEMENT WHILE IT IS BEING MACHINED

TECHNICAL FIELD

The present invention relates to an apparatus for checking thickness dimensions of semiconductor wafers during the machining on a grinding machine, including a detection system with a light source in the infrared band, a detector of reflected beams, and an optical probe, the light source and the detector being connected to the optical probe for emitting infrared beams along a longitudinal path towards a first surface of the wafer being machined, and for receiving, substantially along the longitudinal path, beams reflected by the first surface and by at least one different surface defined by the wafer being machined, a support and positioning element for the optical probe, and a control and processing unit connected to the detection system.

The present invention also relates to a method for checking thickness dimensions of semiconductor wafers during the machining on a grinding machine by means of an infrared optical probe and an associated support and positioning element, including the steps of providing infrared beams and transmitting the latter, through the optical probe, along a longitudinal path towards a first surface of the wafer being machined, detecting beams that are reflected by the first surface and by at least one different surface defined by the wafer being machined and are received through the longitudinal path and the optical probe, and processing the reflected beams by means of interferometric systems in order to obtain information about thickness dimensions of the wafer being machined.

BACKGROUND ART

There are known systems for checking thickness dimensions of semiconductor slices, or wafers, in the course of machining on machine tools, more specifically grinding machines and polishing machines.

The known systems are of different kind and can include, for example, gauging heads with mechanical feelers that touch at least one surface of the wafer being machined. Systems of this kind, which may affect the checked piece and do not allow to fall below certain dimensional values, cannot be applied in the event there is needed, as frequently occurs, to accurately check the thickness of a semiconductor wafer having one side fixed to a film or a support element. Other known systems employ probes of a different kind, for example capacitive probes, inductive probes (eddy current probes or other) or ultrasonic probes. However, the limits of these systems concern both the dimension that can be checked (for example a thickness of less than 100 micron cannot be checked) and the achievable resolution (not less than 10 micron). In order to overcome these limits, systems with optical probes can be employed. U.S. Pat. No. 6,437,868 relates to an application of this kind, including a reflection optical system which is axially located inside the element supporting the wafer to be checked. By virtue of the characteristics of the material or materials of which it is made (a semiconductor material, typically silicon), the wafer or layers of which the wafer is made is/are partly transparent to the used infrared light and its/their thickness is checked at the opposite side with respect to the side which is grinded. Frequently, it is necessary or convenient to carry out checking at the same side which is grinded, and optical probes enable to carry out such checking, as shown for example in the Japanese patent application published with No. JP-A-08-216016. For the purpose of improving the reliability of the performed checking, it is generally convenient to keep clean the surface whereon the optical probe acts by means of a cleaning fluid such as air or water.

In this way the operation of the optical probe may be affected, in particular owing to unwanted and uncontrollable alterations of the characteristics of the transmitted and/or received beams that are due to the discontinuities of the transmission element and/or to turbulence phenomena in the cleaning fluid. Moreover, the different media generate a partial absorption of the radiation and thus limit the luminous intensity given back to the probe.

As a consequence, it is necessary to employ higher electrical amplifications, and the probe becomes more exposed to background noises.

In the event cleaning air is employed, this latter must be carefully filtered for avoiding to introduce foreign material which would interfere with the checking and would contaminate the surface, causing a consequent increasing of costs. Moreover, the mechanical effect of the air jet on the piece being machined, in particular on very small silicon thicknesses (until 5-10 micron) is not negligible.

DISCLOSURE OF THE INVENTION

An object of the present invention is to provide an apparatus and a method for checking thickness dimensions of semiconductor wafers during the grinding operations that be particularly reliable, that can be applied in a flexible way and that assure high standards of performance, thus overcoming the problems of the known apparatus and methods. An apparatus according to the present invention includes an optical probe and a particular support and positioning element for such probe, wherein a low flow fluid is piped at a limited area which the beam, emitted and received by the optical probe, passes through. In practice, a fluid layer or cushion in laminar flow, which keeps the piece surface clean without causing turbulences, is generated. The probe is located and referred in the support and positioning element in such a way that the light beam, typically in the infrared band, travels for a section of path through the air (with low absorption) and for a short section of path in the fluid cushion which fills the space between the probe and the machined surface of the piece (with limited absorption). The section of path in the air and the one in the fluid are preferably separated by a glass. Advantageously, the utilized fluid can be the same fluid which is used in the course of the grinding operations, typically demineralized water.

According to a preferred embodiment of the invention, the support and positioning element includes radial channels (for example four, forming angles of 90° with respect to each other) that are arranged in such a way that they are tangent to the separating glass. The fluid is piped in the radial channels and laps such glass. In this way, air bubbles forming is prevented, and a regular flow of the fluid and the maintaining of the laminar flow are improved.

BRIEF DESCRIPTION OF THE DRAWINGS

The invention is now described with reference to the enclosed sheets of drawings, given by way of non limiting examples, wherein:

FIG. 1 is a simplified side section of an apparatus for thickness checking according to the present invention, with some details partly shown in front view, and FIG. 2 is a section of the apparatus shown in FIG. 1, according to the broken line II-II of FIG. 1.

BEST MODE FOR CARRYING OUT THE INVENTION

FIG. 1 shows an apparatus for checking thickness dimensions of an element in a working condition. The checked element is for example a slice or wafer 1, of semiconductor material such as silicon, that may be formed of layers 1', 1", 1''', with different physical features, separated by discontinuity surfaces 2", 2'''. The structure of the wafer with layers and discontinuity surfaces is per se well known and is shown in a very schematic way in FIG. 1. The number and dimensions of layers is also shown just as an example. The thickness checking can be carried out while a first surface 2 of the wafer 1 is grinded on an appropriate machine tool, which is per se known and, for the sake of simplicity, is indicated in FIG. 1 with the reference number 6 showing a grinding wheel in a simplified way.

A detection system includes an optical probe 3 of a known type connected to a control and processing unit 10 by means of an optical fibre 5, a source 11 emitting light in the infrared band, and a detector 12 which receives reflected beams and provides corresponding electrical signals. The source 11 and the detector 12, per se known, are shown in FIG. 1 in a simplified way, for example as components of the control and processing unit 10. A support and positioning element 7 is fixed to an external support 9 in a known way, and houses the probe 3 defining the position of this latter with respect to the first surface 2. A protection sheath 13, partly shown in front view in FIG. 1, houses the optical fibre 5.

As previously said, the optical probe 3 is of a known type. Without going into details about operation, the probe 3 emits a beam of infrared radiations that travels along a longitudinal path 4 and in part are reflected by the first surface 2 of the wafer 1, in part pass through the wafer 1—by virtue of the typical characteristics of the material of which each of the layers 1', 1", 1''' is made—and are reflected by the discontinuity surfaces 2", 2''' and/or by an opposite external surface 2'. The beams reflected by the different surfaces 2, 2', 2" and/or 2''' substantially travel along the same longitudinal path 4 and are transmitted to the detector 12, the output signals thereof are suitably processed in circuits of the control and processing unit 10 by interferometric methods, for obtaining information concerning thickness dimensions of the wafer, i.e. the thickness of the layers 1', 1", 1''' and/or the total thickness of the wafer 1. Systems of this kind enable to check wafers with an extremely small thickness (even less than 10 micron).

The support and positioning element 7 has a main body 14 substantially cylindrically shaped with an axial opening 15 which communicates with the probe 3 for enabling the radiations beam to pass along the longitudinal path. A closing plate 16 is connected to one end of the main body 14, for example by means of a threaded coupling, and includes an exit hole 17 which is aligned with the axial opening 15. A separating glass 20 is placed between the main body 14 and the plate 16, and is locked by the coupling between these two parts at the axial opening 15. The glass 20 seals such axial opening 15 by means of a ring gasket or "O-ring" 19.

In the plate 16 of the support and positioning element 7 there are hydraulic ducts 22 with a radial entry opening 23, and internal channels 25 that put in communication the radial entry opening 23 with the exit hole 17, the latter facing the first surface 2 of the wafer 1 in the working position shown in FIG. 1. In the example shown in the figures, the internal channels 25 are four, radially placed with respect to the longitudinal path 4, and are arranged so as to form angles of 90° with respect to each other. The radial opening 23 of the hydraulic ducts 22 communicates—in a known manner which is shown in simplified way in FIG. 1 with an arrow 26—with an external source of low flow liquid 27, for example the same water used as coolant in the grinding operations. The liquid 27 is piped by the hydraulic ducts 22 towards the exit hole 17, through which such liquid 27 flows out from the plate 16 and reaches the surface 2, being machined, of the wafer 1. The presence of the four internal channels 25 that are radially arranged and tangent to the surface of the glass 20 improves a regular flown of the liquid 27, substantially in laminar flow, which laps the glass 20 and, flowing out through the hole 17, generates a liquid cushion 30 between the probe 3 and the surface 2 of the wafer 1.

Hence, the longitudinal path 4 of the beam of radiations (emitted and reflected) includes a section of path through the air, in the axial opening 15 where the absorption is minimal, and, once passed through the separating glass 20, a short section of path through the liquid cushion 30 which flows in a substantially laminar flow. The discontinuities in such longitudinal path 4 are thus under control and constant (not casual, as, for example, in a surface of turbulent water). This renders fully reliable the results that are achieved by means of interferometric processing, since it is possible to operate with algorithms that enable to identify and eliminate spurious thicknesses that are present in the longitudinal path 4 of the beam.

Variants with respect to what has been illustrated and herein so far described are feasible, for example in the implementation and configuration of the hydraulic ducts 22 in the support and positioning element. In fact, the number and/or the arrangement of the internal channels can be different with respect to those (25) hereinbefore illustrated, ensuring, however, the forming of the liquid cushion 30 with the appropriate characteristics previously listed and stressed.

The invention claimed is:

1. An apparatus for checking thickness dimensions of semiconductor wafers during the machining on a grinding machine, including:
   a detection system with a light source in the infrared band, a detector of reflected beams and an optical probe, said light source and said detector being connected to the optical probe for emitting infrared beams along a longitudinal path towards a first surface of the wafer being machined and for receiving, substantially along said longitudinal path, beams reflected by said first surface and by at least one different surface defined by the wafer being machined;
   a control and processing unit connected to the detection system; and
   a support and positioning element for the optical probe including hydraulic ducts that are connected to an external source of a liquid and are adapted to generate a cushion of liquid in laminar flow between the optical probe and said first surface of the wafer being machined, said longitudinal path including said liquid cushion, said hydraulic ducts including an entry opening and a plurality of internal channels radially arranged with respect to said longitudinal path and communicating with an axial exit hole which is adapted to be arranged facing said first surface of the wafer, to generate said cushion of liquid in laminar flow.

2. The apparatus according to claim 1, wherein said internal channels are four and are arranged in such a way that they form angles of 90° with respect to each other.

3. The apparatus according to claim 1, wherein the support and positioning element includes a main body and a closing plate, said hydraulic ducts being provided in the closing plate.

4. The apparatus according to claim 1, wherein the support and positioning element defines an axial opening, the longitudinal path including said axial opening.

5. The apparatus according to claim 4, wherein the axial opening is sealing separated from the hydraulic ducts by means of a glass.

6. The apparatus according to claim 1, wherein said liquid is demineralized water.

7. The apparatus according to claim 1, wherein said liquid is also used in the machining of the wafer on the grinding machine.

8. The apparatus according to claim 1, wherein said detector is adapted to emit electrical signals corresponding to the received reflected beams, the control and processing unit including circuits connected to the detector and adapted to receive said electrical signals and to perform processing of the interferometric type.

9. A method for checking thickness dimensions of semiconductor wafers during the machining of a grinding machine by means of an infrared optical probe and of an associated support and positioning element, including the steps of:
   generating infrared beams and transmitting the latter, through the optical probe, along a longitudinal path towards a first surface of the wafer being machined;
   piping a liquid through hydraulic ducts arranged in said support and positioning element, and generating a cushion of said liquid in laminar flow between the optical probe and said first surface of the wafer being machined, the liquid being piped in a plurality of internal channels to facilitate a regular flow of the liquid and the maintaining of the laminar flow, said longitudinal path including a section of path through the air and a short section of path through the cushion of liquid;
   detecting beams that are reflected by said first surface and by at least one different surface defined by the wafer being machined, and are received through the longitudinal path and the optical probe; and
   processing the reflected beams with interferometric systems for obtaining information about thickness dimensions of the wafer being machined.

10. The method according to claim 9, wherein said liquid is the coolant used in the machining of the wafer on the grinding machine.

11. The method according to claim 9, wherein said at least one different surface defined by the wafer is an external surface of the wafer opposite to said first surface.

12. The method according to claim 9, wherein said wafer is formed of at least two layers, said at least one different surface defined by the wafer is a discontinuity surface separating said at least two layers.

13. An apparatus for checking thickness dimensions of semiconductor wafers during the machining on a grinding machine, including:
   a detection system with a light source in the infrared band, a detector of reflected beams and an optical probe, said light source and said detector being connected to the optical probe for emitting infrared beams along a longitudinal path towards a first surface of the wafer being machined and for receiving, substantially along said longitudinal path, beams reflected by said first surface and by at least one different surface defined by the wafer being machined;
   a control and processing unit connected to the detection system; and
   a support and positioning element for the optical probe including an axial opening and hydraulic ducts that are connected to an external source of a liquid and are adapted to generate a cushion of liquid in laminar flow between the optical probe and said first surface of the wafer being machined, said longitudinal path including said axial opening and said liquid cushion, said hydraulic ducts including an entry opening and internal channels communicating with an axial exit hole which is adapted to be arranged facing said first surface of the wafer, to generate said cushion of liquid in laminar flow,
   wherein the axial opening is sealingly separated from the hydraulic ducts by means of a glass and the internal channels are tangent to a surface of said glass.

* * * * *